United States Patent [19]

Tiede

[11] Patent Number: 5,055,720
[45] Date of Patent: Oct. 8, 1991

[54] CURRENT MIRROR SENSE AMPLIFIER WITH REDUCED CURRENT CONSUMPTION AND ENHANCED OUTPUT SIGNAL

[75] Inventor: John W. Tiede, Colorado Springs, Colo.

[73] Assignee: Simtek Corporation, Colorado Springs, Colo.

[21] Appl. No.: 575,978

[22] Filed: Aug. 31, 1990

[51] Int. Cl.$^5$ .................. H03K 19/12; H03K 17/16
[52] U.S. Cl. .................. 307/530; 307/451; 307/272.1; 307/279; 307/263; 307/264
[58] Field of Search .............. 307/443, 448, 451, 530, 307/272.1, 279, 263-264

[56] References Cited

U.S. PATENT DOCUMENTS 4,791,324 12/1988 Hodapp .................. 307/530

Primary Examiner—Stanley D. Miller
Assistant Examiner—Margaret Rose Wambach
Attorney, Agent, or Firm—John R. Ley

[57] ABSTRACT

A current mirror sense amplifier includes current control devices connected in series with each pair of transistors forming a reference branch and an amplifying branch of the amplifier. The control devices are connected and biased in a cross latched manner, and when the reference and amplifying branches respond to a differential input signal, the conductivity of the control devices regeneratively changes until the current through both branches is ultimately terminated and the output signal attains a level substantially at the level of one of the supply voltages, Vcc and Vss. The sense amplifier also includes resetting devices for reestablishing the initial conductivity states of the branches and the control devices, in order to allow the sense amplifier to respond to a new differential input signal. Biasing transistors establish initial bias levels for the control devices which prevent them from regenerating into the opposite conductive until a differential input signal is applied.

31 Claims, 5 Drawing Sheets

CURRENT MIRROR SENSE AMPLIFIER WITH REDUCED CURRENT CONSUMPTION AND ENHANCED OUTPUT SIGNAL

This invention relates to current mirror sense amplifiers typically employed to amplify the signals supplied from a memory cell of a semiconductor memory array. More particularly, the present invention relates to improvements in current mirror sense amplifiers which reduce the active current dissipation and increase the output signal level and speed.

BACKGROUND OF THE INVENTION

A typical prior art current mirror sense amplifier 20 is illustrated in FIG. 1. The amplifier 20 is formed using complementary metal oxide semiconductor (CMOS) field effect transistor (FET) technology. The amplifier 20 comprises two branches or circuits. A reference branch is formed by a P-channel transistor 22 connected in series with an N-channel transistor 24. An amplifying branch is formed by another P-channel transistor 26 and an N-channel transistor 28 connected in series. The sense amplifier 20 receives two input signals, one applied at a first input terminal 30 connected to the gate of input transistor 24 and the other applied at a second input terminal 32 connected to the gate of input transistor 28. An output signal from the amplifier 20 is supplied at an output terminal 34 which is connected to the junctions of the channels of transistors 26 and 28, which is also the branch output node of the amplifying branch. The junction of the channels of transistors 22 and 24 are commonly connected to the gates of the transistors 22 and 26 at a reference node 36, which is also the branch output node of the reference branch. The amplifier 20 shown in FIG. 1 is implemented in enhancement mode transistors, and therefore operates between a positive voltage source of power Vcc and a reference or more negative source of power Vss, supplied at first and second power terminals 38 and 40, respectively.

The input terminals 30 and 32 are normally biased at a level approximately midway between the levels of the power sources Vcc and Vss by means not shown (typically the preceding amplifier stages in a memory array integrated circuit). Under such input mid-level bias conditions, the reference branch transistors 22 and 24 are biased in a midpoint 41 of the vertical portion of a typical transfer curve 42 (FIG. 2) of a pair of complementary series connected transistors, such as transistors 22 and 24. The reference node 36 supplies a reference signal for biasing transistors 22 and 26 at the output voltage level of the reference branch transistors 22 and 24. With normal mid-level bias input signals at terminals 30 and 32, the output signal at terminal 34 is also located approximately at the midpoint 41 of the transfer curve 42, because the amplifying transistors 26 and 28 also function in accordance with the transfer curve 42 (FIG. 2).

The current mirror sense amplifier 20 operates in response to a differential input signal at the input terminals 30 and 32 and supplies a single ended output signal at the output terminal 34. First and second input signals are applied at terminals 30 and 32 respectively, and these input signals vary in mutually opposite directions with respect to the normal mid-level bias at these terminals. The first and second input signals define the differential input signal. The output signal at terminal 34 changes substantially from the midpoint on the transfer curve (FIG. 2) due to much smaller relative changes in the magnitude of the input signals. The amount of change in the output signal is the amplified difference between the two input signals, and the level which the output signal assumes is dependent on the relative levels of the input signals, as is illustrated by the following description of operation of the sense amplifier 20.

Assume a positive increase in the input signal applied at terminal 30 and a corresponding decrease in the input signal applied at terminal 32, relative to their normal mid-level bias magnitudes. Transistor 24 becomes more conductive, lowering the reference signal level at the reference node 36 and increasing the conductivity of the transistor 22. A similar effect occurs on transistor 26, and it too becomes more conductive. The decrease in input signal to transistor 28 decreases its conductivity. The increased conductivity of transistor 26 and the decreased conductivity of transistor 28 raise the level of the output signal at the output terminal 34. Thus, a relative increase in the input signal at terminal 30 and a relative decrease in the input signal at terminal 32 cause an increase in the level of the output signal at terminal 34. If the input signal differential is substantial enough, the level of the output signal at terminal 34 will attain a level approximating that of Vcc.

Conversely, an increase in the input signal at terminal 32 and a decrease in the input signal at terminal 30 causes transistor 24 to become less conductive, thereby raising the reference signal level at the reference node 36 and decreasing the conductivity of transistors 22 and 26. The increased signal at terminal 32 causes transistor 28 to become more conductive. The more conductive transistor 28 and the less conductive transistor 26 cause the level of the output signal at the terminal 34 to decrease. Thus, a relative decrease in the input signal at terminal 30 and a relative increase in the input signal at terminal 32 cause a decrease in the level of the output signal at terminal 34. If the input signal differential is substantial enough, the level of the output signal at terminal 34 will attain a level approximating that of Vss.

The amplifier 20 is referred to as a current mirror because, as can be understood from the previous explanation, the change in current flowing through one branch corresponds to or is "mirrored+ with the change in current in the other branch. The mirror effect occurs because the transistors 22 and 26 control the amount of current flowing through both branches, and both transistors 22 and 26 are comparably or equally affected by the changes in the bias reference signal at reference node 36.

An important point to note with respect to the prior art amplifier 20 is that an active current will always flow through and be dissipated by the reference branch transistors 22 and 24, except in the one case where the input signal applied to terminal 30 is at the level of Vss, which terminates the conduction of transistor 24. Rarely, however, will an input signal situation exist where the reference branch does not consume current, because the input signals usually do not approach the levels of Vcc and Vss, and then if the input signals do approach the levels of Vcc and Vss, there is only one active state where the reference branch does not consume current.

The vast majority of applications for a current mirror sense amplifier are as a later stage amplifier, to supply either a high logical signal (approaching Vcc) or a low logical signal (approaching Vss) from two differentially-related output signals representative of a single logical state of an addressed memory cell of a memory array. One such application is in SRAM (static random access memory) cells, where the output signal must be held for a considerable length of time. While supplying the output signal, the reference branch consumes or dissipates current. The current consumed during these conditions generates undesirable heat and reduces the amount of power available for other circuit components.

Another concern applicable to a current mirror sense amplifier is the level of the output signal. The output signal level should clearly establish one logical state or the other, in response to a reasonable input signal differential and for a reasonable number of circuit components which form the load for the sense amplifier. If the level of the output signal is insufficient, another sense amplifier or an additional stage of amplification will be required to obtain the desired signal level. Of course additional amplifying stages consume additional space in the integrated circuit and require the fabrication of additional components. Accordingly, it is desirable to maximize the output signal level from the sense amplifier.

It is against this background information pertaining to prior art current mirror sense amplifiers, and the considerations related to current consumption and maximizing the output signal changes, that the present invention has evolved.

SUMMARY OF THE INVENTION

In accordance with one of its major aspects, the current mirror sense amplifier includes a control means connected to supply, and control the supply of, current to the reference branch and to the amplifying branch. Each branch of the sense amplifier includes an input device which receives one input signal of a differential input signal. Each branch of the sense amplifier also includes a second device which is connected to the input device of the branch at a branch output node. The branch output node of the reference branch, referred to as a reference node, is connected to bias the second devices of both branches and thereby control the current through each branch. The output signal from the sense amplifier is derived from the branch output node of the amplifying branch. Each control means is connected to the second devices of each branch at a bias node and is operatively controlled by the signal level at the bias node of the opposite branch, as a result of a cross latched control or bias connection. As a result of the cross latched control arrangement, each control means begins changing its conductivity in response to the changes in the signal level at the bias nodes created by the differential input signal. The control means continue to regeneratively change conductive states until they reach the fully conductive and fully nonconductive states. The fully nonconductive control means will terminated the flow of current through one of the branches, and the second device of the other branch will terminate the flow of current through the other branch. When the control means connected to the amplifying branch becomes fully conductive, the output signal is raised substantially to the level of the power supply for the sense amplifier.

Full rail to rail (between Vcc and Vss) level changes in the output signal are available. The greater output signal level changes may avoid the need for additional stages of amplification. Furthermore, once the output signal is established, the current consumed by the sense amplifier is reduced or terminated, thereby substantially reducing the current consumption compared to a prior art current mirror sense amplifier.

Reset means are included in the sense amplifier to reset the control means from the fully conductive and the fully nonconductive conditions established by the cross latched regenerative operation after the application of an input signal. The sense amplifier is thereby conditioned to respond to a new differential input signal.

A more complete understanding and appreciation of the present invention and some of its improvements can be obtained by reference to the accompanying drawings, which are briefly discussed below, from the following detailed description of a presently preferred embodiment of the invention, and from the appended claims.

DETAILED DESCRIPTION

Figure 1:
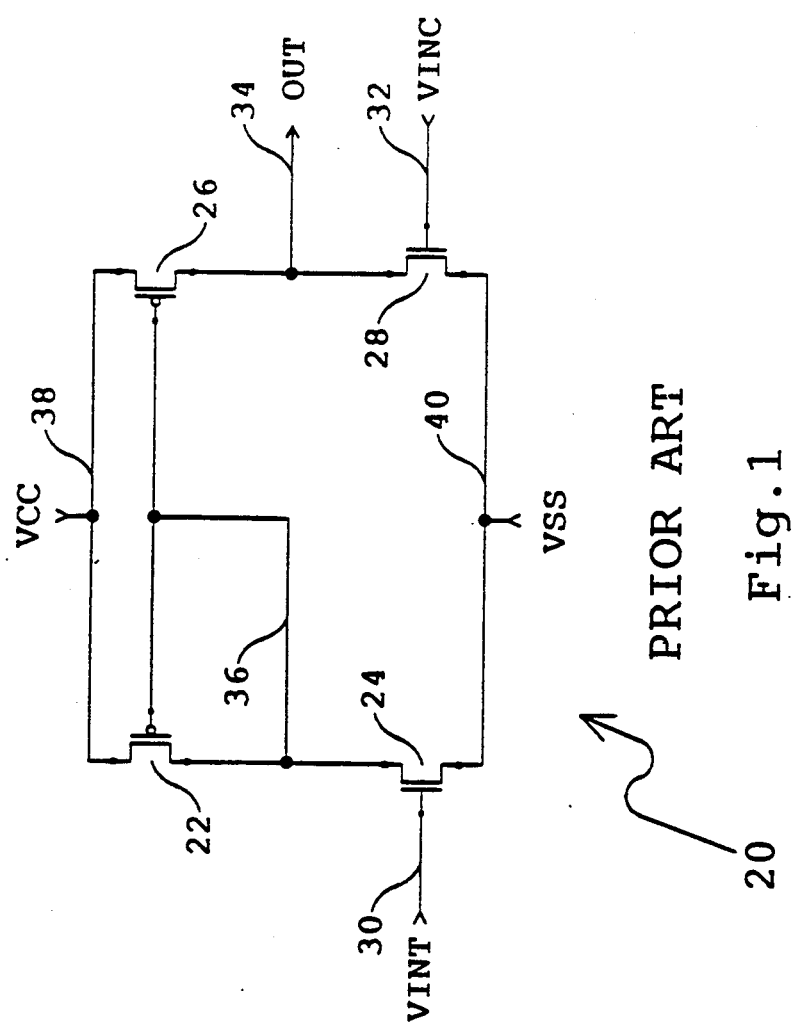
FIG. 1 is a schematic circuit diagram of a prior art current mirror sense amplifier, described in detail above.
Figure 2:
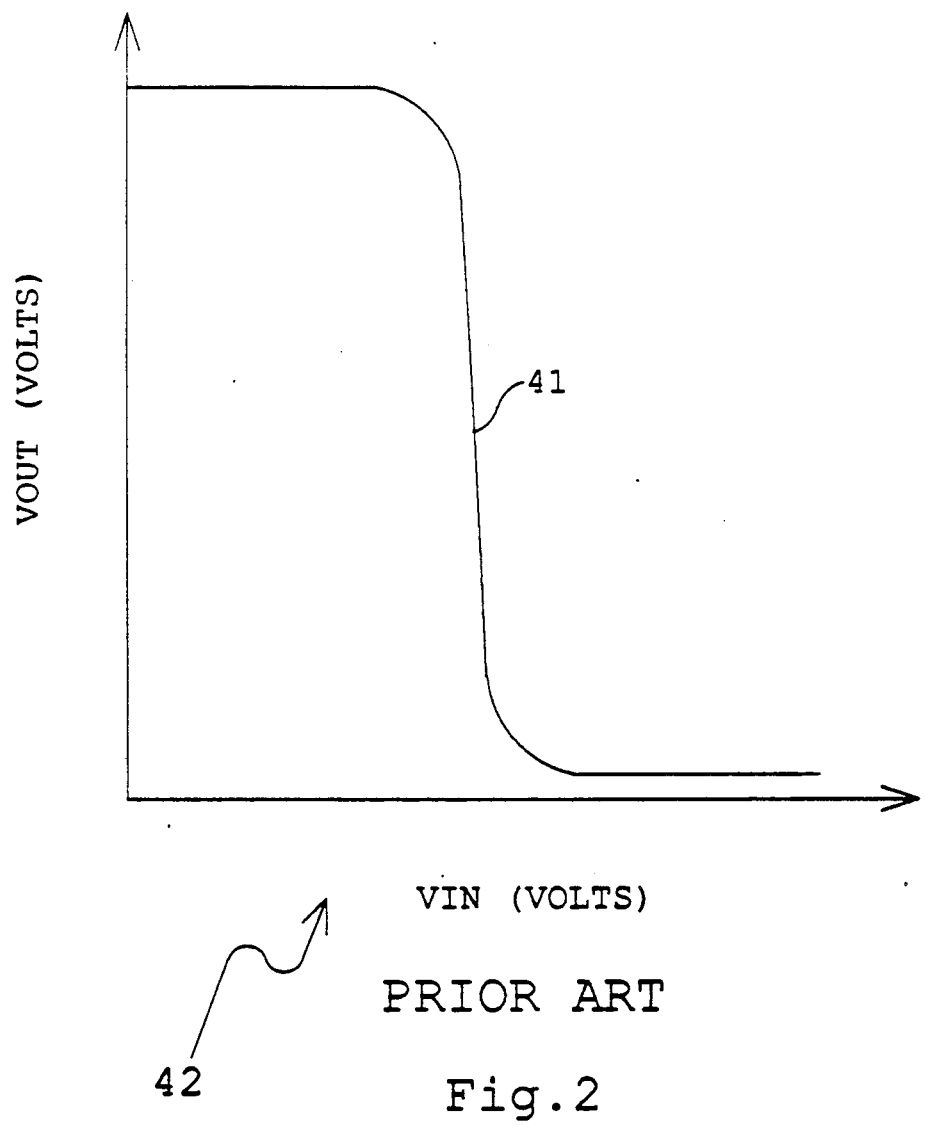
FIG. 2 is a graph illustrating the transfer characteristics of a pair of CMOS transistors connected in series as an amplifier, as described above in conjunction with the prior art current mirror sense amplifier shown in FIG. 1.
Figure 3:
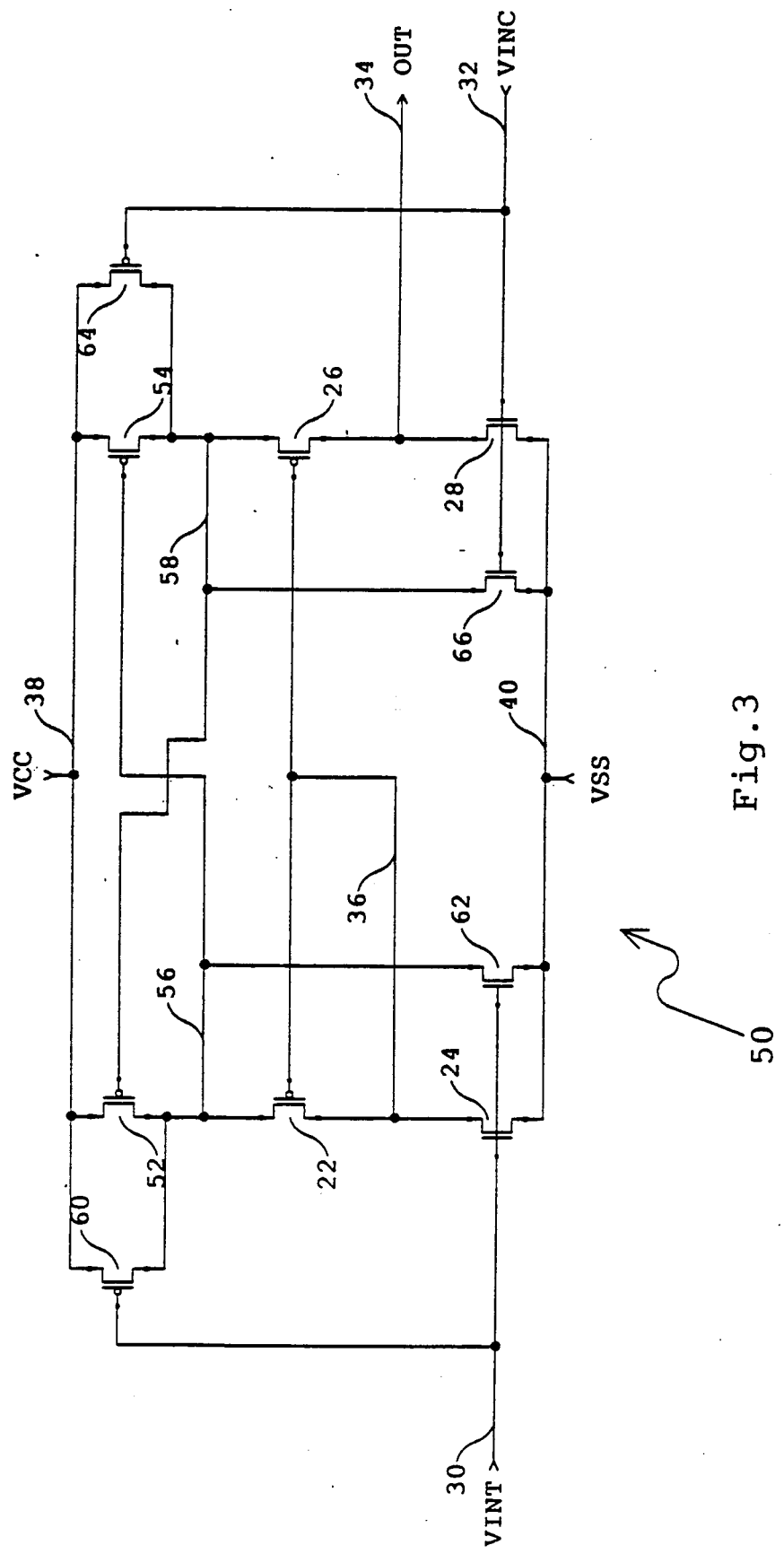
FIG. 3 is a schematic circuit diagram of a basic embodiment of an improved current mirror sense amplifier incorporating the present invention.

A basic embodiment of the improved current mirror sense amplifier (sense amp) 50 incorporating the present invention is illustrated in FIG. 3. The sense amp 50 includes the same components previously described in conjunction with the prior art amplifier 20 shown in FIG. 1, and those same common components are referenced by the same reference numerals in FIG. 3. In addition however, the sense amp 50 includes a pair of P-channel control transistors 52 and 54 which have their channels connected in series with the channels of transistors 22 and 26 at junctions which define first and second bias nodes 56 and 58, respectively. The transistors 52 and 54 are biased in a cross latched manner, with the gate of transistor 52 connected to the second bias node 5B of the amplifying branch and with the gate of transistor 54 connected to the first bias node 56 of the reference branch. The reference branch control transistor 52 controls the current conducted through the reference branch of the sense amp 50, and the amplifying branch control transistor 54 controls the current conducted through the amplifying branch, in accordance with the levels of first and second bias signals which appear on the first and second bias nodes 56 and 58, respectively. As will be more apparent from the following description, the transistors 52 and 54 and their cross latch bias connection to the bias nodes of the opposite branch of are one example of control means for controlling the current supplied from the power supplying means (node 38) to the branches of the sense amp 50 to reduce the current consumption. The control transistors 52 and 54 are also one example of means for driving the output signal of the sense amp 50 between Vcc and Vss in full rail to rail signal level changes.

The sense amp 50 also includes four biasing transistors 60, 62, 64 and 66. The transistors 60 and 62 have their channels connected in series at the first bias node 56 of the reference branch. The gates of both transistors 60 and 62 are connected to the input terminal 30. In the same manner, the biasing transistors 64 and 66 have their channels connected in series at the second bias node 58 of the amplifying branch. The gates of both transistors 64 and 66 are connected to the input terminal 32. The series connected transistors 60 and 62 and the series connected transistors 64 and 66 are each connected between the power supplying terminals 38 and 40. The transistors 60 and 62, and transistors 64 and 66, are sized appropriately to function as voltage dividers, thereby establishing an initial bias level signal voltages at nodes 56 and 58 which are equal and between Vcc and Vss, for example at about 60% of the value of Vcc above Vss. The transistor pair 60 and 62, and the transistor pair 64 and 66, are each examples of means for supplying an initial bias level signal at each bias node, and the initial bias level signal at each bias node is different than the potential at the power supplying terminals 38 and 40.

The additional components of basic sense amp 50 influence its operation in the following described manner. The first example of operation involves the application of a more positive input signal at terminal 30 and a more negative input signal at terminal 32. Transistors 24 and 62 become more conductive, as do transistors 22 and 26. Transistor 60 becomes less conductive. Because the larger size and effect of transistors 22 and 24 compared to the biasing transistors 60 and 62, the initial bias level signal at node 56 is overcome and the signal at node 56 decreases. Transistors 28 and 66 become less conductive, and transistor 64 becomes more conductive. Because the larger size and effect of transistors 26 and 28 compared to the biasing transistors 64 and 66, the initial bias level signal at node 58 is overcome and the signal at node 58 increases. The signal at node 58 increases even though transistor 26 may become somewhat more conductive, since the reduced conductivity of the transistor 28 reduces the current flow through transistors 26 and 28.

The increasing signal at node 58 decreases the conductivity of transistor 52, and the decreasing signal at node 56 increases the conductivity of transistor 54. Once this imbalance starts as a result of the described changes in conductivity of the transistors 52 and 54, a regenerative effect occurs because of the cross latched connection of the transistors 52 and 54, until transistor 54 becomes fully conductive and transistor 52 becomes fully nonconductive. The signal at node 58 raises to essentially the level of Vcc, since the source to drain voltage drop across transistor 54 is very small. The signal at node 58 turns transistor 52 completely off, because the voltage at node 58 relative to Vcc is less than the source to gate threshold voltage required for transistor 52 to conduct. The nonconductive transistor 52 terminates the current flow through the reference branch transistors 22 and 24. The size of transistor 60 is not sufficient to contribute much current to the node 56 if it is slightly conductive, but usually it will be nonconductive because the increased voltage at the input terminal 30 is sufficient to essentially turn off transistor 60. This situation exists even if the change in the input signals from the midpoint bias levels is not to Vcc and Vss, because a small imbalance created in the bias signals at nodes 56 and 58 by small differential input signals will cause enough of an imbalance in the bias of the control transistors 52 and 54 that they will regenerate to the fully conductive and fully nonconductive states.

In this manner, the undesirable standby current which is normally dissipated through the reference branch of a prior art current mirror sense amplifier is terminated. Furthermore, since the source to drain voltage drop across the control transistor 54 is essentially negligible and the source to drain voltage drop across the conductive transistor 26 of the amplifying branch is also essentially negligible, the output signal voltage at the output terminal 34 is raised substantially to the level of Vcc. The output signal level is not limited by the more substantial threshold voltage level drop across the output transistor 26, which is the case with the prior art current mirror sense amplifier 20 shown in FIG. 1.

Similar advantages and improvements occur in the sense amp 50 when the input signal at terminal 30 decreases and the input signal at terminal 32 increases. Transistors 24 and 62 become less conductive, as do transistors 22 and 26. Transistor 60 becomes more conductive, and the signal at node 56 increases. Transistors 28 and 66 become more conductive, and transistor 64 becomes less conductive. The signal at node 58 decreases, even though transistor 26 may become somewhat less conductive since the conductivity of the transistor 28 controls the current flow through transistors 26 and 28.

The decreasing signal at node 58 increases the conductivity of transistor 52, and the increasing signal at node 56 decreases the conductivity of transistor 54. Once this imbalance starts as a result of the described changes in conductivity of the transistors 52 and 54, a regenerative effect occurs until transistor 52 becomes fully conductive, bringing the signal at node 56 to essentially the level of Vcc, since the source to drain voltage drop across transistor 52 is very small. The signal level at node 56 turns transistor 54 completely off, because the voltage at node 56 relative to Vcc is less than the source to gate threshold voltage required for transistor 54 to become conductive. The nonconductive transistor 54 terminates the current flow through the amplifying branch transistors 26 and 28. The size of transistor 64 is not sufficient to contribute much current to the node 58 if it is slightly conductive, but usually it will be nonconductive because the increased signal at the input terminal 32 is sufficient to essentially turn off transistor 64. As the signal at node 56 increases, the signal at node 36 also increases, which has the effect of reducing the conductivity of the transistors 22 and 26 until they become nonconductive. Thus under this condition there is no active current dissipation in either the reference branch or the amplifying branch. The increased signal level at the input terminal 32 causes the transistor 28 to bring the output terminal to essentially the level of Vss, because the drain to source voltage drop across the transistor 28 is essentially negligible.

Again, the current which is normally dissipated through the reference branch of a prior art current mirror sense amplifier is terminated. Furthermore, since the source to drain voltage drop across the control transistor 52 is essentially negligible and the source to drain voltage drop across the conductive amplifying branch transistor 28 is also essentially negligible, the output signal voltage at the output terminal 34 is lowered substantially to the level of Vss.

It can therefore be appreciated that full rail to rail (Vcc to Vss) voltage swings in the output signal at terminal 34 are established as a result of the control and biasing transistors. Greater gain occurs due to the full rail to rail swings. Less amplifier stages are therefore required to establish the desired signal levels representative of logic states. The amount of current dissipated is substantially reduced during conditions when the sense amplifier is required to supply a constant output signal. By reducing the amount of standby current, less heat is generated and more current is available for use by other components of the integrated circuit.

A well known technique used when reading data from cells of a memory array is to equalize, or equilibrate as it is sometimes called, the bit lines connected to the memory cell prior to reading data from the memory cell. Equilibrating involves connecting both bit lines to a common reference potential, and thereafter releasing the common connection so that each bit line signal moves toward the signal level established by the addressed memory cell. Equilibrating has the effect of cancelling any residual signal effects which might be present on the bit lines from the memory cell as a result of a previous memory cell data read operation. Equilibrating also decreases the amount of current required from the memory cell to drive the bit lines to signal levels representative of the logical state of the memory cell.

Figure 4:
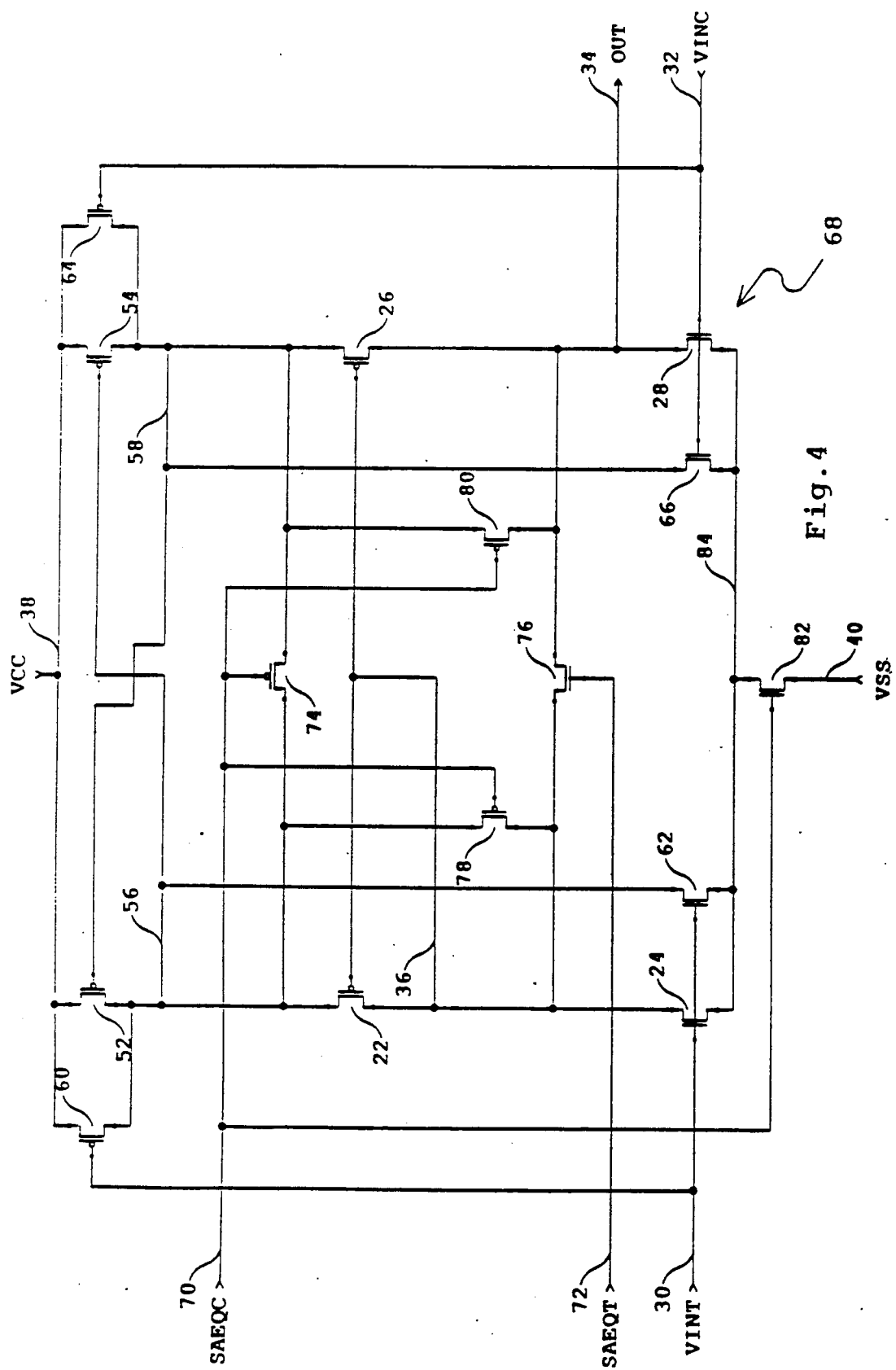
FIG. 4 is a schematic circuit diagram of a complete embodiment of the improved current mirror sense amplifier shown in FIG. 3, incorporating the present invention.

Means for resetting and equilibrating the sense amp are included in a complete embodiment of sense amp 68 is shown in FIG. 4. The sense amp 68 responds to equilibrating signals applied at terminals 70 and 72 from other conventional components (not shown) of a memory array integrated circuit to reset itself from both of its two operational states previously described. The sense amp 50 will not automatically recover from those prior states, due to the cross latch regenerative effect of the transistors 52 and 54. It is therefore necessary to neutralize or equalize the bias signals on the bias nodes 56 and 58 so the control transistors 52 and 54 will release from the fully conductive and fully nonconductive states which they previously attained as a result of the application of a differential input signal. As will be understood, the sense amp 68 includes means responsive to the equilibrating signals for resetting the control transistors 52 and 54 and causing the sense amp 68 to reliably supply an output level signal representative of the logical state of the memory cell, as represented by the bit line signals from the memory cell.

The sense amp 68 includes the same components previously described in conjunction with the basic sense amp 50 shown in FIG. 3, and those same common components are referenced by the same reference numerals in FIG. 4. In addition however, the sense amp 68 includes a P-channel transistor 74 connected between the nodes 56 and 58, and upon the application of a negative voltage level equilibrating signal at terminal 70, the transistor 74 shorts the nodes 56 and 58 together. An N-channel transistor 76 is connected between the node 36 and the output terminal 34. Upon the application of a positive voltage equilibrating signal at terminal 72, the transistor 76 shorts the node 36 and the terminal 34 together. A P-channel transistor 78 is connected between nodes 56 and 36, and another P-channel transistor 80 connects node 58 with the output terminal 34. The application of the ground level equilibrating signal at terminal 70 causes transistor 78 to short nodes 56 and 36 together and causes transistor 80 to short node 58 to the output terminal 34.

The equilibration signals at terminals 70 and 72 cause transistors 74, 76, 78 and 80 to become simultaneously conductive and short to a common point the nodes 36, 56 and 58 and the output terminal 34. In this commonly shorted condition, the transistors 22 and 26 are inoperative because there is no potential difference between their sources and drains, and the control transistors 52 and 54 have their gates connected to a common reference. Accordingly, when the equilibrating signals at terminals 70 and 72 are released, the input signals at terminals 30 and 32 will have the immediate effect of causing the sense amplifier 50 to assume the proper state representative of the logic state indicated by the input signals at nodes 30 and 32.

At certain times in the operation of the memory cell, the sense amp 68 will not be used. During those times, it is desirable to disable the sense amp 68 so it will consume no current whatsoever. This is accomplished by a N-channel transistor 82. The gate of transistor 82 is connected to terminal 70. A ground reference level signal at terminal 70, as occurs during equilibration, causes transistor to become nonconductive. Since transistor 82 connects the remainder of the sense amp 68 to Vss, it controls the current flow and current dissipation through the sense amp 68. When it is desireable to activate the sense amp 68 after equilibration occurs, the signal at terminal 70 returns to a positive level approximately at Vcc, and transistor 82 becomes conductive and the sense amp 68 becomes operative in time for the input signals to create the desired output signal at the terminal 34.

Figure 5:
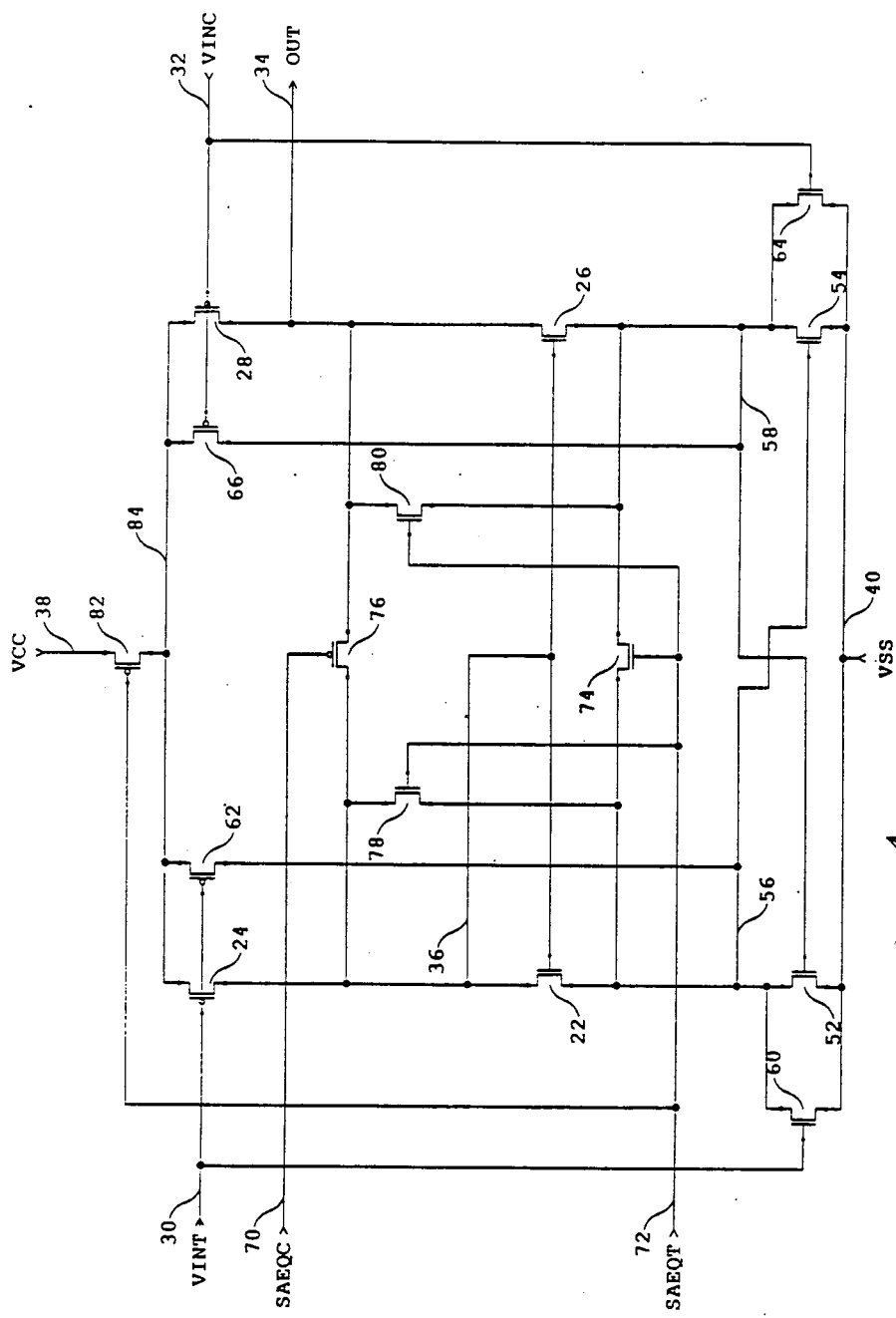
FIG. 5 is a schematic circuit diagram of the embodiment of the sense amplifier shown in FIG. 4, wherein P-channel and N-channel transistors are substituted for one another.

The sense amplifier embodiments have been shown and described with reference to enhancement mode P- and N-channel FET transistors. Essentially the same circuit having the equivalent functionality can be implemented in complementary form by substituting N-channel transistors for P-channel transistors, and vice versa, as is shown in FIG. 5.

Embodiments of the improved current mirror sense amplifier of the present invention, and a number of its improvements and advantages, have been described with a degree of particularity. It should be understood, however, that this description has been made by way of preferred example, and that the invention itself is defined by the scope of the appended claims.

The invention claimed is:

1. A current mirror sense amplifier receptive of a differential input signal and operative for supplying a single ended output signal related to the differential input signal, said amplifier including field effect transistors (FETs) each of which has a channel through which current flows and a gate which controls the flow of current through the channel in relation to a signal applied to the gate, said amplifier comprising:

first and second input terminals upon which separate first and second input signals are respectively applied, the first and second input signals defining the differential input signal;

an output terminal from which the output signal is supplied;

a reference branch including first and second complementary reference branch FETs having their channels connected in series at a junction defining a reference node and having the gate of the second reference branch FET connected to the reference node and having the gate of the first reference branch FET connected to the first input terminal;

an amplifying branch including first and second complementary amplifying branch FETs, having their channels connected in series at a junction defining the output terminal and having the gate of the second amplifying branch FET connected to the reference node and having the gate of the first amplifying branch FET connected to the second input terminal;

the reference branch FETs establishing a reference signal at the reference node having a magnitude related to the magnitude of the first input signal;

the reference signal biasing the second amplifying branch FET to control the current flowing through the amplifying branch in a mirrored relationship to the current flowing through the reference branch;

the second input signal biasing the first amplifying branch FET to control the current flowing through the first amplifying branch FET in an opposite relation to the current flowing through the second amplifying branch FET;

the oppositely varying current conductivity characteristics of the amplifying branch FETs creating an output signal of a magnitude which is related to the difference between the first and second input signals;

power source means for supplying power to said sense amplifier;

reference control means connected to the power source means and also connected to the reference branch at a first bias node for supplying current form the power source means to the reference branch to flow through the channels of the reference branch FETs;

amplifying control means connected to the power source means and also connected to the amplifying branch at a second bias node for supplying current from the power source means to the amplifying branch to flow through the channels of the amplifying branch FETs;

the reference control means also connected to the second bias node and operative for controlling the current supplied from the power source means to the channels of the reference branch FETs in relation to the magnitude of a second bias signal at the second bias node;

the amplifying control means also connected to the first bias node and operative for controlling the current supplied from the power source means to the channels of the amplifying branch FETs in relation to the magnitude of a first bias signal at the first bias node;

the conductivity characteristics of the reference and amplifying branch FETs creating a mutually opposite and differential change in the magnitudes of the first and second bias signals in response to the first and second input signals;

the reference control means responding to the change in the magnitude of the second bias signal to change the magnitude of current supplied at the first bias node to the reference branch FETs;

the amplifying control means responding to the change in the magnitude of the first bias signal to change the magnitude of the current supplied at the second bias node to the amplifying branch FETs;

the amplifying control means and the reference control means responding to the mutually opposite and differential changes in the first and second bias signals by regeneratively amplifying the magnitude of the differential of the first and second bias signals until one of either the amplifying control means or the reference control means substantially terminates the current flow through the corresponding one of the branches and the second branch FET of the other branch substantially terminates the current flow through the other branch.

2. A current mirror sense amplifier as defined in claim 1, wherein:
one of the reference and amplifying control means further responds until the other control means substantially applies the potential of the power source means to the bias node to which the other control means is connected.

3. A current mirror sense amplifier as defined in claim 2, wherein:
the other control means is the amplifying control means;
the second branch FET of the amplifying branch substantially applies the potential of the second bias node to the output terminal; and
the output signal at the output terminal is substantially at the potential of the power source means.

4. A current mirror sense amplifier as defined in claim 1, wherein:
the reference control means comprises a FET having its channel connected between the power source means and the first bias node and its gate connected to the second bias node; and
the amplifying control means comprises a FET having its channel connected between the power source means and the second bias node and its gate connected to the first bias node.

5. A current mirror sense amplifier as defined in claim 1, further comprising:
means connected to each bias node and to the power source means for supplying an initial bias level signal to each bias node which is different than the potential at the power source means.

6. A current mirror sense amplifier as defined in claim 5, wherein said means for supplying an initial bias level signal further comprises:
a first means for supplying the initial bias level signal connected to the first bias node;
a second means for supplying an initial bias level signal connected to the second bias node; and wherein:
the bias level signals supplied by the first and second means to the first and second bias nodes are approximately equal prior to the input signals creating changes in the first and second bias signals.

7. A current mirror sense amplifier as defined in claim 6, wherein:
the first means for supplying the initial bias level signal is connected to the first input terminal and is operative to change the initial bias level signal supplied to the first bias node in response to a change in the first input signal; and
the second means for supplying the initial bias level signal is connected to the second input terminal and is operative to change the initial bias level signal supplied to the second bias node in response to a change in the first input signal.

8. A current mirror sense amplifier as defined in claim 7, wherein:
the first and second means for supplying the initial bias level signals respectively respond to a change in the first and second input signals to correspondingly change the magnitudes of the initial bias level signals at the first and second bias nodes consistently with the change in the magnitudes of the bias signals created by the control means connected to each bias node.

9. A current mirror sense amplifier as defined in claim 8, wherein:
the contributions to the signals at the bias nodes established by the control means predominate over the contributions to the signals at the bias nodes established by the means for supplying the initial bias level signal at each bias node to establish the bias signals in predominance over the initial bias level signals at each bias node upon changes in the input signals.

10. A current mirror sense amplifier as defined in claim 5, wherein the initial bias level supplying means comprises:
a FET having its channel connected between the power source means and the first bias node and its gate connected to the first input terminal; and
a FET having its channel connected between the power source means and the second bias node and its gate connected to the second input terminal.

11. A current mirror sense amplifier as defined in claim 5, wherein the initial bias level supplying means comprises:
a pair of FETs having their channels connected in series at the first bias node and their gates connected to the first input terminal and operatively forming a voltage divider; and
a pair of FETs having their channels connected in series at the second bias node and their gates connected to the second input terminal and operatively forming a voltage divider.

12. A current mirror sense amplifier as defined in claim 5, wherein:
the power source means comprises first and second power terminals through which current is applied to said sense amplifier; and
the initial bias level supplying means further comprises:
a first FET having its channel connected between the first power terminal and the first bias node and its gate connected to the first input terminal;
a second FET having its channel connected between the first bias node and the second power terminal and its gate connected to the first input terminal;
a third FET having its channel connected between the first power terminal and the second bias node and its gate connected to the second input terminal; and
a fourth FET having its channel connected between the second bias node and the second power terminal and its gate connected to the second input terminal.

13. A current mirror sense amplifier as defined in claim 1, further comprising:
reset means connected to the bias nodes and operative when selectively energized for controlling each control means to conduct substantially the same current through each branch.

14. A current mirror sense amplifier as defined in claim 13, wherein:
the reset means comprises a reset FET having its channel connected between the first and second bias nodes.

15. A current mirror sense amplifier as defined in claim 13, wherein the reset means further comprises:
means connected to the first and second bias nodes for selectively establishing a reset signal which is the same at both bias nodes; and wherein:
the control means responds to the reset signal to supply approximately the same current to both branches and to allow the FETs of both branches to establish substantially the same bias signals at the bias nodes.

16. A current mirror sense amplifier as defined in claim 15, further comprising:
equilibrating means connected to the output terminal and to the bias nodes and operative when selectively energized for connecting the output terminal to the bias nodes.

17. A current mirror sense amplifier as defined in claim 16, wherein:
the equilibrating means is further connected to the reference node and is further operative when selectively energized for connecting the reference node to the output terminal and to the bias nodes.

18. A current mirror sense amplifier as defined in claim 16, wherein the reset and equilibrating means comprise:
the reset FET having its channel connected between the first and second bias nodes;
a first equilibrating FET having its channel connected between the reference node and the output terminal;
a second equilibrating FET having its channel connected between the first bias node and the reference node;
a third equilibrating FET having its channel connected between the second bias node and the output terminal; and
at least one equilibrating terminal to which the gates of the reset and equilibrating FETs are connected and upon which at least one equilibrating signal is applied to energize the reset and equilibrating FETs.

19. A current mirror sense amplifier as defined in claim 1, further comprising:
equilibrating means connected to the output terminal and the bias nodes and operative when selectively energized for commonly connecting the output terminal and the bias nodes to a common reference point.

20. A current mirror sense amplifier as defined in claim 19, wherein:
the equilibrating means is further connected to the reference node and is further operative when selectively energized for also connecting the reference node to the common reference point.

21. A current mirror sense amplifier as defined in claim 1, further comprising:
disabling means connected to the power source means and operative when selectively energized by a disabling signal for disconnecting said amplifier from the power source means to prevent said amplifier from consuming current.

22. A current mirror sense amplifier as defined in claim 21, further comprising:

equilibrating means connected to the output terminal, the reference node and to the bias nodes and operative when selectively energized for commonly connecting the output terminal, the reference node and the bias nodes to a common reference point in response to the application of a signal applied to an equilibrating terminal; and wherein the disabling means further comprises:
  a disabling FET connected to the power source means and operative when selectively energized by a disabling signal for terminating the flow of current from said power source means to said amplifier, the disabling FET having its gate connected to the equilibrating terminal.

23. A current mirror sense amplifier as defined in claim 1, wherein:
  the power source means comprises first and second power terminals through which current is applied to said amplifier;
  the reference control means comprises a FET having its channel connected between the first power terminal and the first bias node and its gate connected to the second bias node;
  the amplifying control means comprises a FET having its channel connected between the first power terminal and the second bias node and its gate connected to the first bias node;
  a first bias FET having its channel electrically connected between the first power terminal and the first bias node and its gate connected to the first input terminal;
  a second bias FET having its channel electrically connected between the first bias node and the second power terminal and its gate connected to the first input terminal;
  a third bias FET having its channel electrically connected between the first power terminal and the second bias node and its gate connected to the second input terminal;
  a fourth bias FET having its channel electrically connected between the second bias node and the second power terminal and its gate connected to the second input terminal;
  at least one equilibrating terminal upon which at least one equilibrating signal is supplied;
  a reset FET having its channel connected between the first and second bias nodes;
  a first equilibrating FET having its channel connected between the reference node and the output terminal;
  a second equilibrating FET having its channel connected between the first bias node and the reference node;
  a third equilibrating FET having its channel connected between the second bias node and the output terminal;
  the reset and equilibrating FETs having their gates connected to an equilibrating terminal;
  a disabling FET having its gate connected to the equilibrating terminal and having its channel connected to the second power terminal and operative when selectively energized to conduct current from said power source means through said amplifier.

24. In a current mirror sense amplifier of the type having a reference branch and an amplifying branch, each branch including first input transistor means responsive to a different one of two input signals of a differential input signal and operative for supplying at a branch output node a branch output signal related to the one input signal applied to the branch, each branch also including second transistor means connected to the branch output node of that branch, the second transistor means of each branch also connected to the branch output node of the reference branch and operative for controlling the current flowing through each branch relative to the signal at the branch output node of the reference branch, the amplifying branch supplying an output signal of said sense amplifier at its branch output node related to the magnitude and relative relationship of the two input signals of the differential input signal; an improvement in combination with said sense amplifier comprising:
  control means separately connected at a bias node to the second transistor means of each branch and operative for controlling the current flowing through the first and second transistor means of each branch in relation to the signal level at the bias node of the other branch, the control means cooperating with the second transistor means to terminate the current flow through both branches upon application of the differential input signal and upon supplying of the output signal.

25. In a sense amplifier as defined in claim 24, wherein the improvement further comprises:
  biasing means connected to the bias nodes of both branches and operative for establishing an initial bias signal at the bias nodes to control the control means to supply current to the branches prior to the application of the differential input signal.

26. In a sense amplifier as defined in claim 25, wherein:
  one biasing means is separately connected to each bias node of each branch and each biasing means is further operative to change the initial bias signal in a manner corresponding to the change in the signal level at the bias node created by the application of the input signal to the input transistor means of each branch.

27. In a sense amplifier as defined in claim 25, wherein the improvement further comprises:
  reset means connected to the bias nodes and operative when selectively energized for controlling each control means to conduct substantially the same current through each branch.

28. In a sense amplifier as defined in claim 27, wherein:
  means connected to each bias node for selectively establishing reset signals of the same magnitudes at both bias nodes; and
  the control means responding to the reset signal to supply approximately the same current to both branches and to allow the bias means to establish the initial bias signals at both bias nodes.

29. In a sense amplifier as defined in claim 27, wherein the improvement further comprises:
  equilibrating means connected to the branch output nodes and to the bias nodes and operative when selectively energized for connecting the branch output nodes to the bias nodes.

30. In a sense amplifier as defined in claim 24, wherein the improvement further comprises:
  equilibrating means connected to the branch output nodes and to the bias nodes and operative when selectively energized for connecting the branch output nodes to the bias nodes.

31. In a sense amplifier as defined in claim 24, wherein the improvement further comprises:
  reset means connected to the bias nodes and operative when selectively energized for controlling each control means to conduct substantially the same current through each branch.

* * * * *